US006965628B1

(12) United States Patent
Lenosky et al.

(10) Patent No.: US 6,965,628 B1
(45) Date of Patent: Nov. 15, 2005

(54) DISTRIBUTED FEEDBACK LASER HAVING A DIFFERENTIAL GRATING

(75) Inventors: Thomas Lenosky, Mountain View, CA (US); Giorgio Giaretta, Mountain View, CA (US); Qing Deng, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 267 days.

(21) Appl. No.: 10/284,128

(22) Filed: Oct. 30, 2002

(51) Int. Cl.$^7$ .............................................. H01S 3/08
(52) U.S. Cl. ............................. 372/96; 372/45; 372/46
(58) Field of Search ........................... 372/45, 96, 102, 372/46

(56) References Cited

U.S. PATENT DOCUMENTS

| | | | | |
|---|---|---|---|---|
| 5,040,188 | A | * 8/1991 | Lang et al. | 372/96 |
| 5,208,824 | A | 5/1993 | Tsang | 372/96 |
| 5,241,556 | A | 8/1993 | Macomber et al. | 372/96 |
| 5,506,859 | A | 4/1996 | Ackerman et al. | 372/96 |
| 6,018,541 | A | 1/2000 | Huang | 372/50 |
| 6,111,906 | A | * 8/2000 | Muroya | 372/96 |
| 6,175,581 | B1 | * 1/2001 | Sato | 372/96 |
| 6,577,660 | B1 | * 6/2003 | Muroya | 372/45 |
| 6,594,298 | B2 | * 7/2003 | Ryu et al. | 372/50 |
| 6,771,681 | B2 | * 8/2004 | Bang et al. | 372/46 |

OTHER PUBLICATIONS

Carroll, J. et al., IEE Circuits, Devices and Systems Series 10, *Distributed Feedback Semiconductor Lasers*, SPIE Press Monograph vol. PM 52, Capter 1 & 2, 1998.

Agrawal, Govind P. et al, Semiconductor Lasers 2nd Ed., Chapter 7, *Distributed-Feedback Semiconductor Lasers*, pp. 319-337, 1993.

Nilsson, S. et al., IEEE Photonics Technology Letters,*DFB Laser With Nonuniform Coupling Coefficient Realized by Double-Layer Buried Grating*, vol. 5, No. 10, Oct. 1993.

Boucer, Y, et al., IEEE Journal of Quantum Electronics, *Quasi-Periodic Complex-Coupled Distributed-Feedback Structures With An Exponential-Like Gradient of Coupling*, vol. 33, No. 12, Dec. 1997.

Hansmann, S. et al., IEE Journal of Selected Topics in Quantum Electronics, *Variation of Coupling Coefficients by Sampled Gratings in Complex Coupled Distributed-Feedback Lasers*, vol. 1, No. 2, Jun. 1995.

\* cited by examiner

*Primary Examiner*—Minsun Oh Harvey
*Assistant Examiner*—Cornelius H. Jackson
(74) *Attorney, Agent, or Firm*—Workman Nydegger

(57) ABSTRACT

A distributed feedback ("DFB") laser featuring improved manufacturing yield and operational characteristics is disclosed. The present DFB laser includes a bottom confinement layer, an active region, and a top confinement layer disposed atop an n-doped substrate. A p-doped first top layer having a first index of refraction is disposed atop the top confinement layer. A grating is defined in the top surface of the first top layer, and a p-doped second top layer is overlaid on the grating. The two laser end facets are antireflectively coated. The grating is anisotropically etched to define a low kappa grating half and a high kappa grating half. Light waves produced in the active region interact with the grating and are biased toward the low kappa grating half that results in the majority of light signals passing through the end facet adjacent the low kappa grating half.

24 Claims, 3 Drawing Sheets

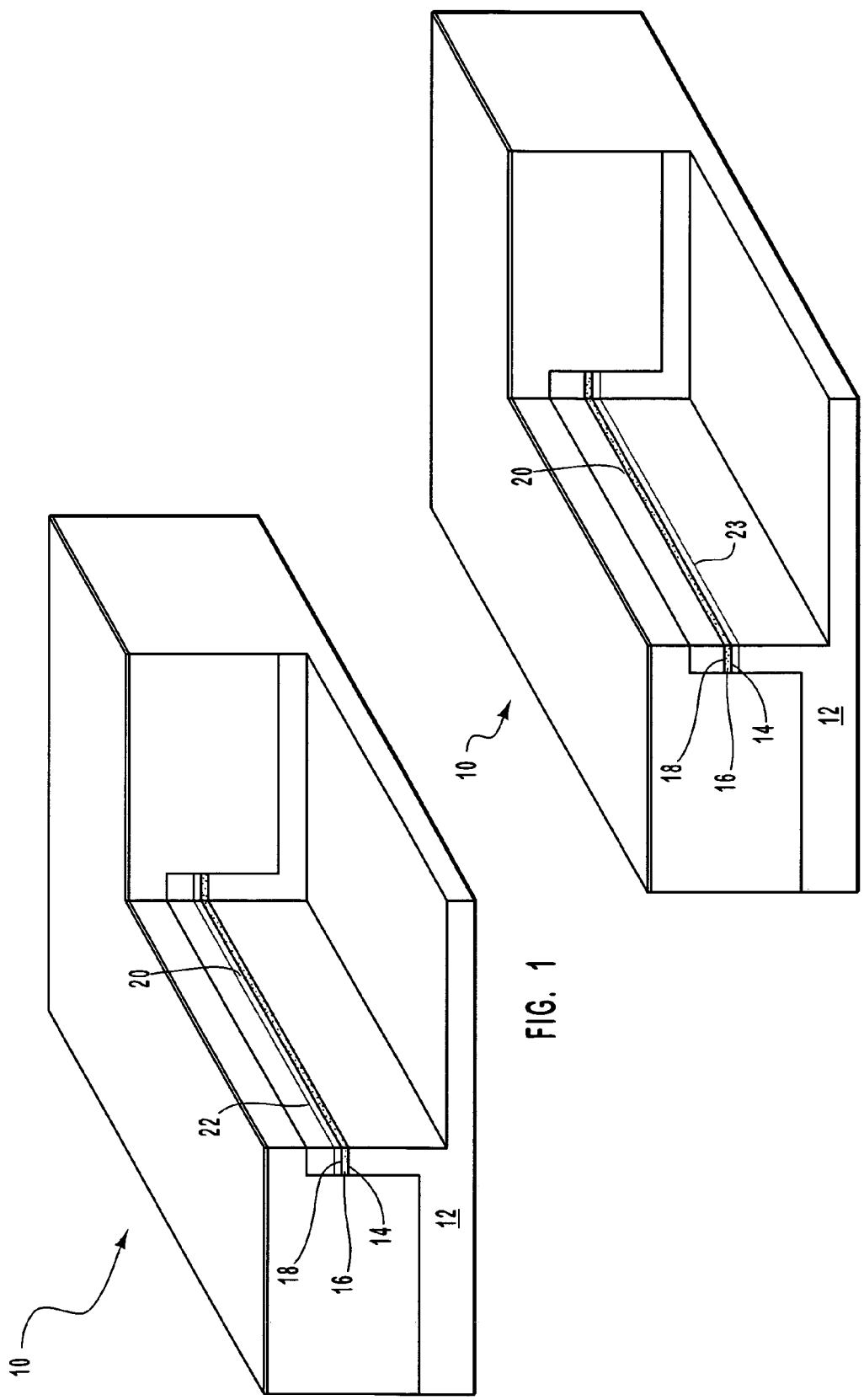

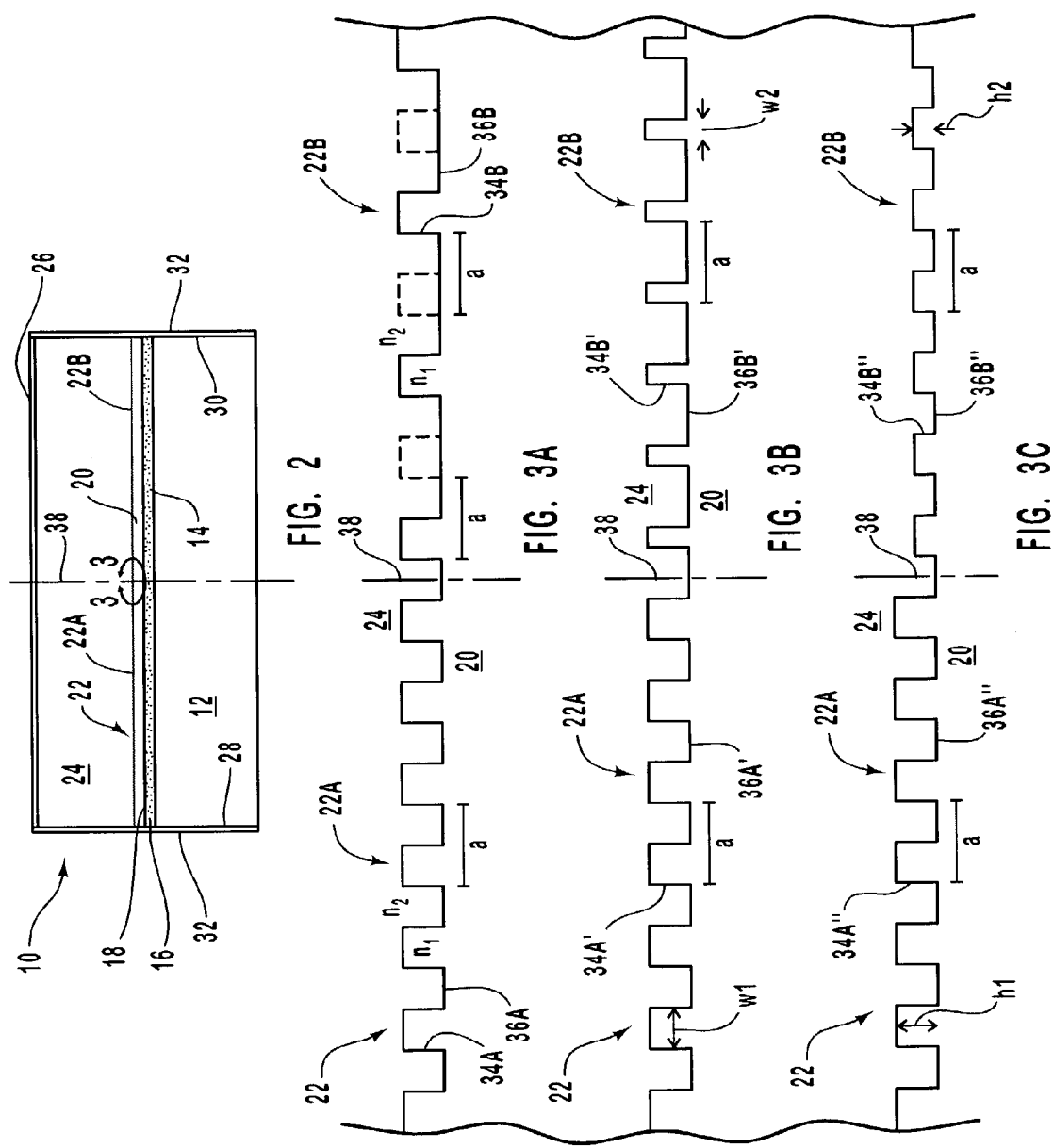

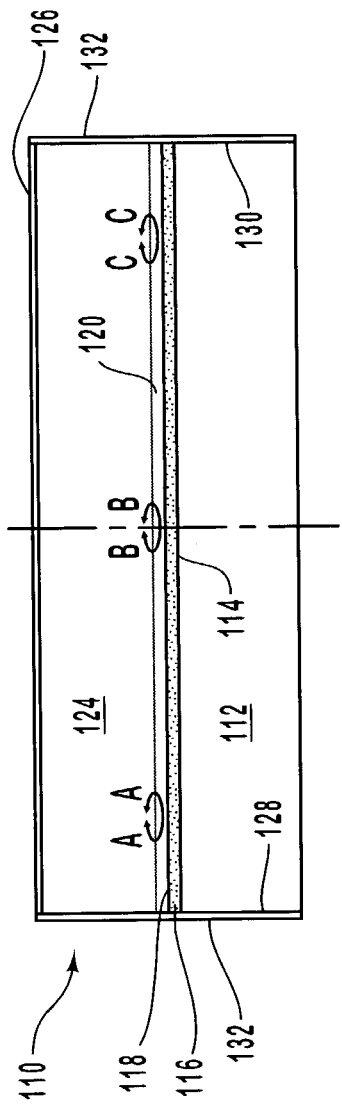
FIG. 4
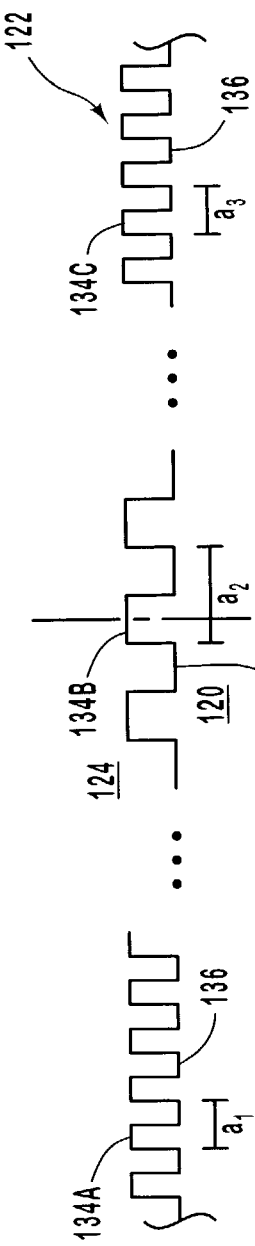
FIG. 5A
FIG. 5B
FIG. 5C
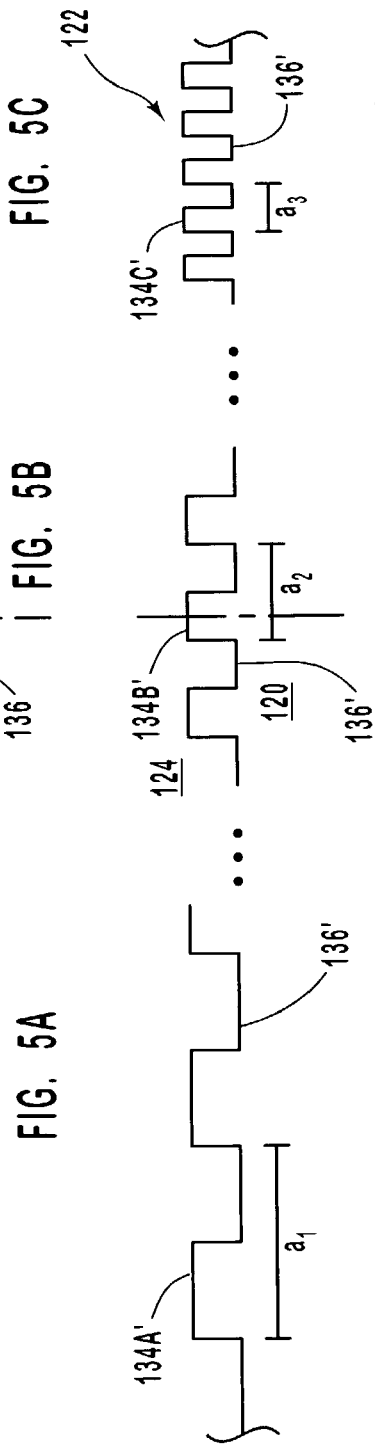
FIG. 6A
FIG. 6B
FIG. 6C

US 6,965,628 B1

DISTRIBUTED FEEDBACK LASER HAVING A DIFFERENTIAL GRATING

BACKGROUND OF THE INVENTION

1. The Field of the Invention

The present invention generally relates to semiconductor laser devices. More particularly, the present invention relates to a distributed feedback laser device having a structure that improves both manufacturing yield and operating performance of the laser device.

2. The Related Technology

Semiconductor lasers are currently used in a variety of technologies and applications, including optical communications networks. One type of semiconductor laser is the distributed feedback (DFB) laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A coherent stream of light that is produced in the active region of the DFB laser can be emitted through either longitudinal end, or facet, of the laser body. One facet is typically coated with a high reflective material that redirects photons produced in the active region toward the other facet in order to maximize the emission of coherent light from that facet end.

A grating is included in either the top or bottom layer to assist in producing a coherent photon beam. For example, the grating is typically produced in the top layer of the DFB laser body by depositing a first p-doped top layer having a first index of refraction atop the active region, then etching evenly spaced grooves into the first top layer to form a tooth and gap cross sectional grating structure along the length of the grating. A second p-doped top layer having a second index of refraction is deposited atop the first top layer such that it covers and fills in the grating structure. During operation of the DFB laser, the tooth and gap structure of the grating, which is overlapped by optical field patterns created in the active region, provides reflective surfaces that couple both forward and backward propagating coherent light waves that are produced in the active region of the laser. Thus, the grating provides feedback, thereby allowing the active region to support coherent light wave oscillation. This feedback occurs along the length of the grating, hence the name of distributed feedback laser. After reflection is complete, the amplified light waves are then output via the output end facet as a coherent light signal. DFB lasers are typically known as single mode devices as they produce light signals at one of several distinct wavelengths, such as 1,310 nm or 1,550 nm. Such light signals are appropriate for use in transmitting information over great distances via an optical communications network.

DFB lasers as described above are typically mass produced on semiconductor wafers. Many DFB laser devices can be formed on a single wafer. After fabrication, the DFB lasers are separated from one another by a cleaving process, which cuts each device from the wafer. This cleaving process creates each end facet of the DFB device body. Unfortunately, limitations inherent in the cleaving process do not allow the laser device to be cut such that a precisely desired distance is established between the end facet and the nearest adjacent grating tooth.

The inherent variability of the distance between the end facet and the adjacent grating tooth created as a result of cleaving can cause several problems. First, the end facet, especially an end facet that is coated with a high reflective coating, may be disposed adjacent the nearest grating tooth such that the laser during operation will exhibit poor sidemode suppression, which in turn results in undesired optical frequencies being amplified within the laser device. These undesired optical frequencies can spoil the monochromatic nature of the DFB laser output and result in reduced performance for the apparatus in which the laser device is disposed.

Other problems that can arise from the arbitrary cleaving process include an increased incidence of chirp and low power output from the DFB laser device. Chirp, or the drifting of the optical output wavelength over time, is magnified by improper distances between the grating and the high-reflective end facet caused by the cleaving process. Similarly, low power output is evidence of less-than-ideal cleaving of the DFB laser device.

If one or more of the above-described problems is detected in a particular DFB laser device after manufacture and testing, it often must be discarded, thereby lowering the yield of acceptable DFB laser devices that are produced from a wafer. In some cases, the percentage of rejected devices suffering from any of the above problems can exceed 50% per wafer.

Attempts to mitigate the effects of low precision cleaving have involved the addition of one or more quarter phase shifts in the grating. However, the typical DFB grating has a continuous pattern over the entire wafer. This continuous pattern allows for the lithography to be simple. Yet, the installation of one or more quarter phase shifts requires the use of a special lithography apparatus. Additionally, special techniques are required in order to add such phase shifts. These special requirements necessarily increase the cost of production of each DFB device.

In light of the above, it would be desirable to enable the production of DFB laser devices where the yield per wafer is substantially increased. Further, a need exists for the DFB laser to exhibit good sidemode suppression while limiting chirp and output power loss. Moreover, such a solution should be simply implemented, thereby limiting production cost increases.

BRIEF SUMMARY OF THE INVENTION

Briefly summarized, embodiments of the present invention are directed to a DFB laser device that overcomes the problems created by imprecise cleaving operations performed on DFB devices during their manufacture. Specifically, the present invention discloses a DFB laser device having a differential grating configuration that can be produced with high device yield and desirable operating characteristics, such as good sidemode suppression, low chirp, and nominal power output.

In one embodiment, the DFB laser device comprises a laser body having first and second end facets. The laser body includes an n-doped semiconductor substrate having disposed thereon an active region for producing coherent photons. Atop the active region is disposed a p-doped first top layer. The first top layer is etched or otherwise shaped to define a grating structure that extends longitudinally along the length of the laser. A p-doped second top layer is disposed atop the grating structure defined in the first top layer. A contact layer is disposed on the second top layer to enable electrical connectivity for the DFB laser device.

In greater detail, the grating structure comprises a precisely defined set of grooves etched into the first top layer of the device. The grooves define a periodic tooth and gap cross sectional shape similar to a square sine wave. In the present invention, the grating structure is differentially modified in order to alter the reflectivity, or kappa ("κ") of the grating. Specifically, the tooth and gap structure of the grating is modified along the length of the laser device in one or more of several possible configurations. For example, the tooth and gap structure can be modified such that every second tooth along a portion of the grating length is missing, resulting in the adjacent gap being twice as long. In another configuration, the width of each tooth is reduced in a portion of the grating length such that gap between adjacent teeth is lengthened. In yet another configuration, the height of each tooth in a portion of the grating can be reduced or increased with respect to other portions of the grating.

Each of the changes to the grating structure above serves to modify the value of κ along the grating length. In one embodiment, a first half of the grating length is uniformly grated, while the second half is modified in accordance with one of the possible configurations above. In such a configuration, the first grating half possesses a relatively higher κ value than the second grating half. This relative κ differential causes photons in the lower κ grating half to experience fewer reflections per unit length of the grating than those photons in the higher κ grating half. This in turn results in a net increase in the number of photons emitted by the laser device through the primary outlet end facet that is adjacent the lower κ grating half. The primary outlet end facet is coated with an anti-reflective coating that enables nearly all photons incident upon the facet to pass therethrough. The secondary end facet adjacent the high κ grating half is also anti-reflective coated so as to allow most photons incident upon it to also pass through. Though these photons are not utilized as optical output from the DFB device, their number is minimized given the high κ rating of the adjacent grating half, which increases the reflectivity per unit length of the grating half and consequently reduces the number of photons exiting through the secondary end facet. Because neither facet of the present DFB laser is coated with a high reflective coating, and thus neither facet significantly participates in photon reflection, the problems associated with imprecise cleaving of the laser end facets are avoided.

In another embodiment of the present invention, the length, or period, of each tooth and gap combination of the grating structure is modified along the length of the grating according to one of several possible configurations. As a result, chirp and frequency response of the DFB laser can be improved. The modification of the grating period can be combined with the κ modification operations described above to further increase the quality of the photonic output of the DFB laser device.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 1 is a perspective cutaway view of a distributed feedback laser device manufactured in accordance with one embodiment of the present invention and FIG. 7 illustrates a perspective cutaway view of another embodiment of a distributed feedback laser device manufactured in accordance with another embodiment of the present invention.

FIG. 2 is a cross sectional view of the laser of FIG. 1;

FIG. 3A is a close-up cross sectional view of a portion of the grating structure shown in FIG. 2 according to one embodiment thereof;

FIG. 3B is a close-up cross sectional view of a portion of the grating structure shown in FIG. 2 according to another embodiment thereof;

FIG. 3C is a close-up cross sectional view of a portion of the grating structure shown in FIG. 2 according to yet another embodiment thereof;

FIG. 4 is a cross sectional view of a distributed feedback laser made in accordance with one embodiment of the present invention;

FIG. 5A is a close-up cross sectional view of one portion of the grating structure shown in FIG. 4;

FIG. 5B is a close-up cross sectional view of another portion of the grating structure shown in FIG. 4;

FIG. 5C is a close-up cross sectional view of yet another portion of the grating structure shown in FIG. 4;

FIG. 6A is a close-up cross sectional view of one portion of the grating structure shown in FIG. 4 according to an alternative embodiment;

FIG. 6B is a close-up cross sectional view of another portion of the grating structure shown in FIG. 4 according to an alternative embodiment; and FIG. 6C is a close-up cross sectional view of yet another portion of the grating structure shown in FIG. 4 according to an alternative embodiment.

DETAILED DESCRIPTION OF THE PREFERRED EMBODIMENTS

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

FIGS. 1–6C depict various features of embodiments of the present invention, which is generally directed to a distributed feedback ("DFB") laser that is configured so as to exhibit improved operating characteristics. The present DFB laser further comprises a design that enables it to be manufactured such that laser device yield per wafer is substantially improved.

Reference is first made to FIG. 1, which shows a cutaway view of a DFB laser device made in accordance with one embodiment of the present invention, and which is generally designated at 10. The DFB laser 10 includes an n-doped bottom layer or substrate 12 on which a bottom confinement layer 14 is disposed. An active layer 16, comprising a plurality of quantum wells or other similar structure, is disposed atop the confinement layer 14 and is covered by a top confinement layer 18. A p-doped first top layer 20 overlies the confinement layer 18. A grating 22 is defined in the first top layer 20. FIG. 7, which is also a cutaway view of a DFB laser, illustrates a grating 23 disposed in the bottom layer or substrate 12. A p-doped second top layer 24 is disposed atop the grating 22. Alternatively, the first and second top layers 20 and 24 can be n-doped, while the substrate 12 is p-doped. A contact layer 26 for providing an electrical signal to the DFB laser 10 is disposed atop the second top layer 24. The various layers described above extend between a first end facet 28 and a second end facet 30, partially shown in FIG. 1. FIG. 1 illustrates several basic components that generally comprise the DFB laser device 10. It is appreciated that additional or alternative layers or structures can be incorporated into the present laser device as will be understood by those of skill in the art.

Reference is now made to FIGS. 2 and 3A, which show the DFB laser device 10 of FIG. 1 in cross section. In the illustrated embodiment, the first and second end facets 28 and 30 are shown having an anti-reflective ("AR") coating 32 disposed thereon. The AR coating 32, which is typically applied after cleaving, reduces reflection of internal light waves off of the end facets 28 and 30 during laser operation and instead allows the light to exit the laser device 10 through the end facets. Though it allows light waves to exit out of both end facets 28 and 30, the present DFB laser device 10 is configured to direct a majority of the coherent light produced by the laser through only one end facet, as will be described.

As mentioned, the grating 22 is disposed on a top surface of the first top layer 20. In greater detail, the grating 22 comprises a periodic series of closely-spaced grooves that are etched or otherwise defined in the first top layer 20. As will be seen, the grooves, when seen in cross section, define a series of teeth 34 protruding from the first top layer 20, and gaps 36 between adjacent teeth. The gaps 36 are filled with the second top layer 24 such that continuous contact is established between the first top layer 20 and the second top layer. Definition of the grating 22 on the first top layer 20 can be accomplished using known grating techniques, including electron beam lithography.

Though both the first top layer 20 and second top layer 24 are similarly doped, each has a distinct index of refraction with respect to one another. As seen in FIG. 3A, which is magnified to show grating detail, the first top layer 20 has an index of refraction n1, while the second top layer has an index of refraction n2. This relative refractive index disparity is required to enable each tooth 34 to act as a feedback surface for reflecting light waves and enabling their coherent propagation within the DFB laser 10, as is known in the art. Thus, the grating serves as a boundary between two similarly doped materials having distinct indices of refraction. Further details concerning the grating 22 are discussed further below.

As already described, both the first and second end facets 28 and 30 are coated with AR coating 32. By making each end facet light transmissive via the AR coating 32, problems that otherwise arise with respect to the imprecise distance between a respective end facet and the last tooth 34 adjacent thereto is eliminated. In other words, light waves that would otherwise reflect off the high reflective end facet (as in the prior art) that is potentially not properly positioned with respect to adjacent teeth 34 of the grating 22 are not, in fact, reflected to undesirably interact with the coherent light waves within the laser device, but are instead allowed to pass through the anti-reflective facet and exit the device. In this way, any problems normally created as a result of the inherent randomness in the cleaving process that defines the end facets 28 and 30 of the DFB device 10 are eliminated by making each end facet anti-reflective via the AR coating 32.

This in turn improves the yield of DFB laser devices from a given wafer while improving the sidemode suppression characteristics of each such device.

Notwithstanding the improvements in light emission integrity made possible by the above AR-coated end facets 28 and 30, this by itself is insufficient to optimize coherent light emission from the DFB laser 10. Without further modification, a laser device having AR-coated end facets will emit approximately one-half of its coherent light through either facet. This results in a significant waste of light emission.

To alleviate the above situation, the grating 22 is modified according to principles taught according to the present invention so as to direct the majority of coherent light emission through only one of the end facets. This is accomplished by anisotropically altering the physical configuration of the grating 22 as a function of position along the grating length. For example, FIG. 3A, which is a close-up view of the circled portion in FIG. 2, shows a portion of the grating 22 near a longitudinal mid-point 38 of the grating length. The grating 22 is bifurcated by an imaginary bifurcation line at the mid-point 38 wherein each half of the grating length defines a distinct tooth and gap structure. On the left side of the mid-point 38 as seen in FIG. 3, a first half 22A of the grating structure, comprising periodic teeth 34A and gaps 36A, is substantially uniform. In contrast to this, a second half 22B of the grating 22, beginning at and continuing to the right of the mid-point 38, is characterized by a second order tooth structure, wherein every second tooth 34B that would otherwise be present (shown in dashes) is missing, and in its place a gap 36B having twice the normal length is disposed. This second order structure shown in FIG. 3A continues from the mid-point 38 along the entire length of the second grating half 22B to the second end facet 30 shown in FIG. 2. Thus, a non-uniform tooth and gap structure is established along the length of the grating 22.

Because of the non-uniform grating structure along the length of the grating 22, the reflectivity per unit length of the grating, or kappa ("κ"), which is related to the particular configuration of the grating, is also non-uniform along the grating length. In the present embodiment, κ is high on the uniform first grating half 22A, and relatively lower on the second grating half 22B. Because κ is directly related to the number of times a light wave will be reflected from the surfaces of the grating teeth, a lower κ number associated with the second grating half 22B indicates that light waves will be reflected by the grating less than those waves traveling through the first grating half 22A, which possesses a higher κ value. This is so because of the particular tooth and gap structure of each grating half 22A and 22B. In the first grating half 22A, for instance, a propagating light wave created in the active region 16 will encounter a tooth/gap interface, and thus a reflective opportunity, at every interval "a," corresponding to the repetitive period of the teeth 34 and gaps 36. On the other hand, a light wave propagating through the second order structure of the second grating half 22B encounters a tooth/gap interface only half as many times as in first half 22A. Thus the light wave is reflected fewer times, which in turn increases the number of light signals that are able to progress to and pass through the second end facet 30. Correspondingly, because a light signal passing though the higher κ value first grating half 22A encounters more reflective opportunities, relatively fewer signals are able to reach and pass through the first end facet 28. Consequently, a substantial majority of light waves pass through the second end facet 30 when the DFB laser 10 is configured with a grating as shown in FIGS. 2 and 3A.

In addition to the second order tooth and gap configuration shown in the second grating half 22B, the grating could be modified to alternatively include a third, fourth, or higher order tooth and gap configuration, if desired. For instance, in a third order configuration, every third tooth is missing from the grating structure. Such grating configurations can be designed so as to achieve the desired reduction or increase in the κ value for the particular grating portion involved.

It is noted that the bifurcated grating structure in FIG. 3A is separated by the imaginary bifurcation line located at the mid-point 38. However, it is not necessary that the bifurcation occur at the mid-point 38. Indeed, and in agreement with the teachings herein, the division of grating structure topology can be defined at any appropriate point along the length of the grating 22. Thus, in the present example the second order grating structure can alternatively occupy one-third of the length of the grating 22 nearest the second end facet 30, while the uniform grating structure portion is defined along the remainder of the grating length. Moreover, the transition from uniform grating structure to second order structure is seen in FIG. 3A occurring abruptly at the mid-point 38. However, the present invention is not restricted to such a configuration. Indeed, the transition from one grating structure to another can occur abruptly or gradually, as may be desired for a particular application. These principles explained here also apply to the following additional embodiments as well.

FIG. 3B illustrates how the circled portion of the grating 22 in FIG. 2 would look if modified in accordance with another embodiment of the present invention. As in the previous embodiment, the grating length here is virtually bifurcated about the mid-point 38 to define first and second grating halves 22A and 22B. In this embodiment, as in the previous embodiment, the first half 22A of the grating 22 has a uniformly periodic length and tooth and gap configuration, wherein each tooth 34A' has a substantially similar width w1. The second half 22B of the grating, however, is modified in its per-tooth duty cycle such that each substantially similar tooth 34B' has a width w2 that is less than the width w1. This correspondingly increases the length of each gap 36B' disposed between the teeth 34B'.

In a similar manner to the previous embodiment, the grating configuration shown in FIG. 3B features a reduced κ value on the second grating half 22B in comparison with the κ value of the first grating half 22A. Specifically, the relatively skinnier teeth 34B' of the second grating half 22B having width w2 are less effective at creating reflections of light waves, and therefore allow a relatively greater number of coherent light waves to proceed without significant reflection to exit through the second end facet 30. Correspondingly, the relatively wider teeth 34A' of the first grating half 22A having width w1 cause substantially more light wave reflection, thereby reducing the overall light emission from the first end facet 28, as desired.

The differences in width between the teeth 34A' and 34B' in FIG. 3B are relative. Accordingly, the width w1 can vary relative to the width w2 in a variety of possible configurations, in addition to those described here.

FIG. 3C depicts another embodiment of the present invention, wherein the amplitude or height of the grating teeth is modified in order to alter the θ value on the grating 22. Here, the first grating half 22A features teeth 34A" having a height h1 and periodic length a. The second grating half 22B, disposed to the right of mid-point 38, possesses teeth 34B" having the same periodic length a, but with a relatively lower height h2.

During operation of the DFB laser 10, the grating 22 shown in FIG. 3C operates in a similar manner to previous embodiments in biasing coherent light emission toward the second end facet 30. In particular, the relatively tall teeth 34A" of the first grating half 22A possess a relatively high κ value in comparison with the relatively lower-height teeth 34B" of the second grating half 22B. This differential in κ values biases light emission toward the second end facet 30 nearest the second grating half 22B, as in previous embodiments.

It should be noted that in each of the embodiments depicted in FIGS. 3A–3C, the periodic length of adjacent tooth/gap pairs remains substantially constant within the respective grating halves. For example, in FIG. 3B, each tooth/gap pair has the same period both on the first grating half 22A and the second grating half 22B. In FIG. 3A, the tooth/gap pairs that are present on the second grating half 22B have the same period as those teeth on the first grating half 22A if the missing teeth of the second grating half are considered. The same principle applies to the tooth/gap pairs in FIG. 3C.

It should also be noted that the designation of a particular end facet for transmission of the majority of coherent light waves is not limited to that described in the accompanying figures. The DFB laser 10 could be alternatively configured such that the majority of coherent light waves exit to the left through the first end facet 28.

It is appreciated that the shape of the teeth 34 in the various embodiments discussed herein can also vary from that depicted. For instance, instead of a square shape, the teeth could have rounded tops or comprise triangular shapes. Notwithstanding the shape of the grating teeth, the present invention can be practiced as described herein.

Reference is now made to FIGS. 4–6C, which depict additional alternative embodiments of the present DFB laser. As cross sectionally seen in FIG. 4, a DFB laser device is generally depicted at 110 and comprises a similar structure to the DFB laser 10 shown in FIGS. 1 and 2. Specifically, the DFB laser 110 comprises an n-doped substrate 112, a bottom confinement layer 114, an active layer 116, and a top confinement layer 118 disposed atop one another in a sandwich fashion. Overlying the top confinement layer 118 is a p-doped first top layer 120 having a grating 122 comprised of closely-spaced grooves defined thereon, and a p-doped second top layer 124 overlying the grating 122. The first and second top layers 120 and 124 each possess differing indices of refraction. A contact layer 126 is disposed atop the second top layer 124. First and second end facets 128 and 130, respectively, are shown having AR coatings 132 applied thereon. Though the details of the grating 122 are not apparent in FIG. 4, they will be further described below in connection with FIGS. 5–6C.

Reference is now made to FIGS. 5A, 5B, and 5C, together with FIG. 4, in describing details of the grating 122. FIGS. 5A, 5B, and 5C are close-up cross sectional views of the designated circled portions A, B, and C, respectively, of the grating 122 shown in FIG. 4. The grating 122, as before, comprises a tooth and gap configuration defined in the first top layer 120 having a plurality of teeth 134 and gaps 136 disposed between adjacent teeth. In contrast to the previous embodiments depicted in FIGS. 2–3C, the tooth period, or distance between the beginning of one tooth/gap pair and the beginning of a succeeding tooth/gap pair, designated as "a," is varied along the grating length. For example, it can be seen in FIGS. 5A–5C that the period a1 of the grating teeth 134A disposed near the first end facet 128 is substantially less than the period a2 of the teeth 134B disposed near the mid-point of the grating 122, indicated at 138. Similarly, the period a3 of the grating teeth 134C near the second end facet 128 is substantially less than those teeth 134B disposed near the mid-point 138. Thus, the period of the teeth disposed along the length of the grating 122 in the present embodiment continuously increases toward the mid point 138 of the grating, and continuously decreases toward the end facets 128 and 130. The total magnitude of period change shown in these and in the foregoing and following figures is merely exemplary; indeed, the magnitude of change can be varied as desired for a particular application. The continuously shaped tooth period of the grating 122 shown in FIGS. 5A–5C serves to improve the power, frequency response, and chirp characteristics of the DFB laser 110 by reducing spatial hole burning (i.e., non-uniform light intensity within the laser). In particular, reduced hole burning can enhance the power output, as well as frequency response, in a single-wavelength laser device. Additionally, because spatial hole burning can influence the wavelength of the coherent light waves emitted by the laser, reduction of such hole burning via the alteration of the grating period as described above can reduce the amount of chirp produced by the laser during modulation. Because the effects due to spatial hole burning are most evident in lasers having a large product of κ and L (the length of the laser), it is in such lasers where the most significant reductions in chirp are anticipated. These principles can therefore be used to improve the operating characteristics of the laser device.

FIGS. 6A, 6B, and 6C depict yet another alternative embodiment of the present invention. FIGS. 6A–6C depict the three regions A, B, and C, of the grating 122 shown in FIG. 4 according to the present embodiment. As illustrated, the period of the grating teeth 134 is continuously varied along the length of the grating 122: the grating teeth 134A' disposed near the first end facet 128 have a relatively large period, as indicated by a1 in FIG. 6A, while the teeth 134B' disposed near the mid-point 138 are intermediately sized, as indicated by a2. The teeth 134C', disposed near the second end facet 130, possess a relatively small period, as indicated by a3. This configuration of the grating 122 enables not only the chirp and frequency response of the DFB laser 110 to be improved, but also biases the coherent light signal toward the first end facet 128, given the higher κ value possessed by the grating portion having a period equal to, or nearly equal to, a1. The embodiment illustrated in FIGS. 6A–6C therefore combines principles taught in connection with the variation of the grating teeth period with those relating to the variation of the κ value along the grating length. This produces a DFB laser device having desirable operating characteristics that minimize problems, such as yield or sidemode suppression, that are associated with imprecise cleaving of the laser device end facets during fabrication.

In light of the present embodiment, it is generally appreciated that the teachings of the various embodiments as disclosed herein can be combined to produce grating configurations not explicitly illustrated here. For example, FIGS. 5A–6C illustrate a grating having teeth that continuously vary in period along the length of the grating. However, it is also possible to configure the grating such that the tooth period abruptly changes at a specified point along the grating length, as seen in FIGS. 3A–3C. Thus, these and other modifications are contemplated as falling under the present invention.

If desired, it is also possible for a phase shift, such as a quarter wavelength phase shift, to be added to the grating structure to further enhance coherent light output from the DFB laser. Such a phase shift can be added at any appropriate location along the grating length, such as near either end facet, or at the mid-point.

Finally, it is noted that, though the gratings discussed herein have been shown as primarily disposed above the active region, it is also possible to dispose a grating made in accordance with the principles taught herein under the active region, such as in the laser substrate.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A distributed feedback laser, comprising:
 a longitudinally extending body including first and second end facets, the body defining a first body portion longitudinally extending between the first end facet and a bifurcation line, and a second body portion longitudinally extending between the second end facet and the bifurcation line, the body comprising:
  a doped bottom layer;
  a doped top layer;
  an active region interposed between said bottom and top layers; and
  a grating defined in one of said bottom and top layers and extending from the first end facet to the second end facet, the grating including:
   a first grating portion extending from the first end facet to the bifurcation line, the first grating portion having a periodic tooth structure;
   a second grating portion extending from the bifurcation line to the second end facet, the second grating portion having a second order tooth structure.

2. A distributed feedback laser as defined in claim 1, wherein each tooth of the grating substantially comprises two spaced apart parallel vertical sides and a horizontal top.

3. A distributed feedback laser as defined in claim 1, wherein a period of the grating structure is substantially constant along a length of the grating.

4. A distributed feedback laser as defined in claim 1, wherein the grating varies abruptly from the first body portion to the second body portion at the bifurcation line.

5. A distributed feedback laser as defined in claim 1, wherein the grating varies continuously along the length of the grating.

6. A distributed feedback laser as defined in claim 1, wherein the bifurcation line is disposed at a longitudinal mid-point of the body.

7. A distributed feedback laser as defined in claim 1, wherein gaps disposed between each tooth in the grating in the first body portion are shorter in length than gaps disposed between each tooth in the grating structure in the second body portion.

8. A distributed feedback laser as defined in claim 1, wherein a width existing between two vertical sides of each tooth in the first body portion is greater than a width existing between the two vertical sides of each tooth in the second body portion.

9. A distributed feedback laser as defined in claim 1, wherein a height of each tooth in the first grating portion is substantially greater than a height of each tooth in the second grating portion.

10. A distributed feedback laser as defined in claim 1, wherein the active region comprises a plurality of quantum wells configured to produce light waves.

11. A distributed feedback laser as defined in claim 1, wherein the grating is defined in the top layer of the body.

12. A distributed feedback laser as defined in claim 1, wherein a first of the two longitudinally extending regions comprises a material having a first index of refraction, and wherein a second of the two longitudinally extending regions comprises a material having a second index of refraction.

13. A distributed feedback laser as defined in claim 1, wherein a period of the grating varies along a length of the grating.

14. A distributed feedback laser as defined in claim 13, wherein a shape of each tooth is substantially the same along the length of the grating.

15. A distributed feedback laser as defined in claim 1, further comprising a phase shifting tooth portion disposed in the grating.

16. A distributed feedback laser as defined in claim 15, wherein a width of the phase shifting tooth portion is equal to one quarter of the wavelength of the light waves produced by the laser.

17. A distributed feedback laser, comprising:
a body including first and second end facets, the first and second end facets having disposed thereon an anti-reflective coating, the body being virtually bifurcated to define a first body half longitudinally extending between the first end facet and a bifurcation line and a second body half longitudinally extending between the second end facet and the bifurcation line, the body comprising:
a doped bottom layer;
a doped top layer, wherein said top layer is doped substantially opposite that of said bottom layer;
an active region interposed between said bottom and top layers; and
a first grating portion in the first body half, the first grating portion having a periodic tooth structure, each tooth having a first width;
a second grating portion in the second body half, the second grating portion having a periodic tooth structure with a period substantially equal to a period of the first grating portion, wherein each tooth in the second grating portion has a second width that is different from the first width.

18. A distributed feedback laser as defined in claim 17, wherein the second width of each tooth in the second grating portion is less than the a first width of each tooth in the first grating portion.

19. A distributed feedback laser as defined in claim 18, wherein the grating varies abruptly from the first body half to the second body half at the bifurcation line.

20. A distributed feedback laser as defined in claim 18, wherein the bifurcation line is disposed at a longitudinal mid-point of the body.

21. A distributed feedback laser as defined in claim 18, wherein gaps disposed between each tooth in the grating in the first grating portion are substantially shorter in length than gaps disposed between each tooth in the second grating portion in the second body half such that the number of light waves emitted through the second end facet nearest the second body half is substantially greater than the number of light waves emitted through the first end facet.

22. A distributed feedback laser as defined in claim 18, wherein a width existing between the two vertical sides of each tooth in the first grating portion is greater than a width existing between the two vertical sides of each tooth in the second grating portion such that the number of light waves emitted from the second end facet nearest the second body portion is substantially greater than the number of light waves emitted through the first end facet.

23. A distributed feedback laser as defined in claim 18, wherein a height of each tooth in the first grating portion is substantially greater than a height of each tooth in the second grating portion.

24. A distributed feedback laser, comprising:
a longitudinally extending body including a first end facet and a second end facet, the body comprising:
a doped bottom layer;
a doped top layer;
an active region interposed between the top and bottom layers; and
a grating defined in one of the top and bottom layers, the grating longitudinally extending from the first end facet to the second end facet, a first portion of the grating having a first tooth and gap structure with a first period and a second portion of the grating having a second tooth and gap structure with the first period, wherein the first tooth and gap structure differs from the second tooth and gap structure such that a value of reflectivity "κ" of the grating varies between the first portion of the grating and the second portion of the grating.

* * * * *

UNITED STATES PATENT AND TRADEMARK OFFICE
CERTIFICATE OF CORRECTION

| | | |
|---|---|---|
| PATENT NO. | : 6,965,628 B1 | Page 1 of 3 |
| APPLICATION NO. | : 10/284128 | |
| DATED | : November 15, 2005 | |
| INVENTOR(S) | : Lenosky et al. | |

It is certified that error appears in the above-identified patent and that said Letters Patent is hereby corrected as shown below:

Cover Page
Item 56, References Cited, OTHER PUBLICATIONS, "Carroll, J et al...", change "M onograph" to --Monograph--
Item 56, References Cited, OTHER PUBLICATIONS, "Carroll, J et al...", change "Capter" to --Chapter--

Drawings
Sheet 1, Replace Figure 1 with the figure depicted herein below, wherein reference numerals --24--, --26--, --28--, and --30-- have been added.

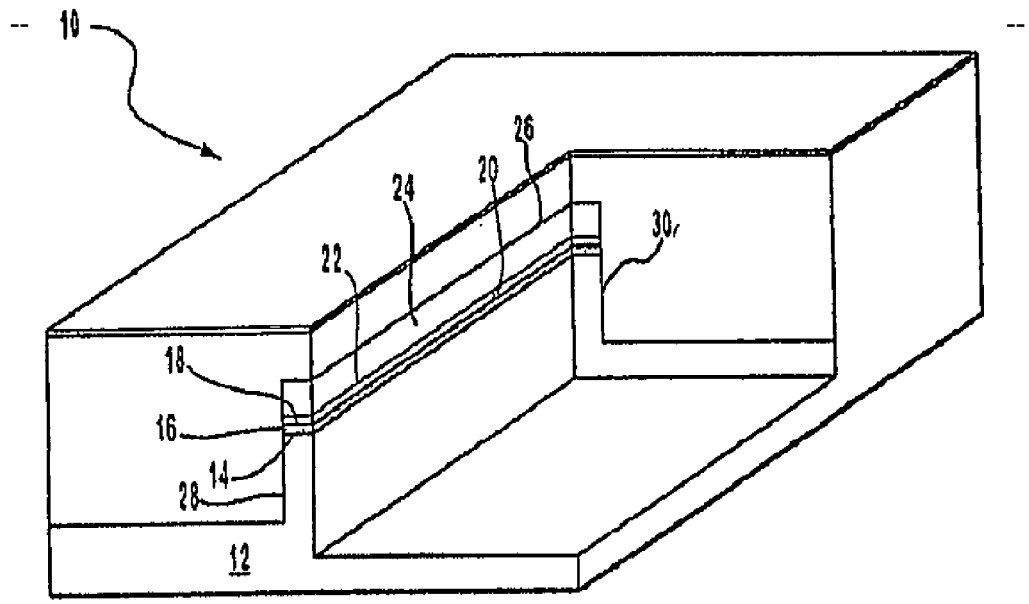

FIG. 1

UNITED STATES PATENT AND TRADEMARK OFFICE
CERTIFICATE OF CORRECTION

| | |
|---|---|
| PATENT NO. | : 6,965,628 B1 |
| APPLICATION NO. | : 10/284128 |
| DATED | : November 15, 2005 |
| INVENTOR(S) | : Lenosky et al. |

It is certified that error appears in the above-identified patent and that said Letters Patent is hereby corrected as shown below:

Drawings (cont'd)
Sheet 3, Replace Figure 4 with the Figure depicted herein below, wherein reference numeral --122-- has been added.

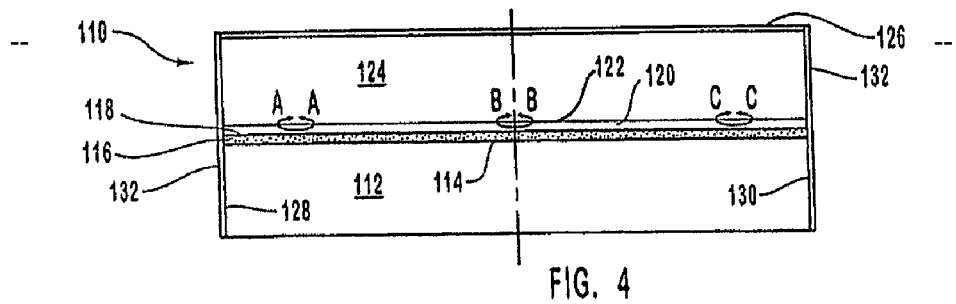

FIG. 4

Column 3
Line 16, before "gap" insert --the--

Column 5
Line 36, change "layer." to --layer 24.--
Line 43, change "n1" to --$n_1$--
Line 44, change "n2" to --$n_2$--
Line 57, before "eliminated" change "is" to --are--

Column 7
Line 62, change "θ" to --κ--

Column 8
Line 63, change "a1" to --$a_1$--
Line 65, change "a1" to --$a_1$--
Line 67, change "a2" to --$a_2$--

UNITED STATES PATENT AND TRADEMARK OFFICE
CERTIFICATE OF CORRECTION

PATENT NO. : 6,965,628 B1
APPLICATION NO. : 10/284128
DATED : November 15, 2005
INVENTOR(S) : Lenosky et al.

It is certified that error appears in the above-identified patent and that said Letters Patent is hereby corrected as shown below:

Column 9
Line 2, change "a2" to --$a_2$--
Line 36, change "a1" to --$a_1$--
Line 38, change "a2" to --$a_2$--
Line 40, change "a3" to --$a_3$--
Line 45, change "a1" to --$a_1$--

Signed and Sealed this

Eighteenth Day of December, 2007

JON W. DUDAS
*Director of the United States Patent and Trademark Office*